United States Patent [19]
Nguyen

[11] Patent Number: 5,371,178
[45] Date of Patent: * Dec. 6, 1994

[54] RAPIDLY CURING ADHESIVE AND METHOD

[75] Inventor: My N. Nguyen, San Diego, Calif.

[73] Assignee: Johnson Matthey Inc., Valley Forge, Pa.

[*] Notice: The portion of the term of this patent subsequent to Sep. 22, 2007 has been disclaimed.

[21] Appl. No.: 162,390

[22] Filed: Dec. 3, 1993

Related U.S. Application Data

[63] Continuation of Ser. No. 843,739, Feb. 28, 1992, abandoned, and a continuation-in-part of Ser. No. 602,504, Oct. 24, 1990, Pat. No. 5,150,195.

[51] Int. Cl.[5] ............................................. C08G 63/44
[52] U.S. Cl. ................................... 528/362; 252/512; 252/514; 428/208; 528/92; 528/363; 528/422
[58] Field of Search ............... 528/362, 92, 363, 422; 252/512, 514; 428/208

[56] References Cited

U.S. PATENT DOCUMENTS

| | | |
|---|---|---|
| 1,743,167 | 1/1930 | Styer . |
| 2,895,270 | 7/1959 | Blaess . |
| 3,586,926 | 6/1971 | Nakamura et al. . |
| 3,595,900 | 7/1971 | Loudas et al. . |
| 4,280,885 | 7/1981 | Savery . |
| 4,375,498 | 3/1983 | Le Minez et al. . |
| 4,401,776 | 8/1983 | Munk ........................... 523/443 |
| 4,552,690 | 11/1985 | Ikeguchi et al. .............. 252/512 |
| 4,604,452 | 8/1986 | Shimp ........................... 528/422 |
| 4,608,434 | 8/1986 | Shimp ........................... 528/422 |
| 4,699,888 | 10/1987 | Dumesnil et al. . |
| 4,709,008 | 11/1987 | Shimp ........................... 528/422 |
| 4,732,702 | 3/1988 | Yamazaki et al. . |
| 4,740,584 | 4/1988 | Shimp ........................... 528/422 |
| 4,740,830 | 4/1988 | Ketley . |
| 4,785,075 | 11/1988 | Shimp ........................... 528/422 |
| 4,831,086 | 5/1989 | Das et al. . |
| 4,839,442 | 6/1989 | Craig, Jr. ...................... 528/422 |
| 4,847,233 | 7/1989 | Shimp ........................... 502/171 |
| 4,861,823 | 8/1989 | Quareshi ....................... 524/606 |
| 4,902,752 | 2/1990 | Shimp . |
| 4,931,545 | 6/1990 | Shimp et al. . |
| 4,940,848 | 7/1990 | Shimp . |
| 4,983,683 | 1/1991 | Shimp . |
| 4,999,699 | 3/1991 | Christie et al. . |
| 5,002,818 | 3/1991 | Licari et al. .................. 428/209 |
| 5,037,691 | 8/1991 | Medney et al. ............... 428/209 |
| 5,068,309 | 11/1991 | Shimp . |
| 5,114,003 | 5/1992 | Jackisch et al. . |
| 5,149,863 | 9/1992 | Shimp et al. . |
| 5,150,195 | 9/1992 | Nguyen . |
| 5,155,066 | 10/1992 | Nguyen . |
| 5,162,574 | 11/1992 | Craig, Jr. . |
| 5,195,299 | 3/1993 | Nguyen . |
| 5,250,600 | 10/1993 | Nguyen . |

OTHER PUBLICATIONS

D. A. Shimp, et al., "New Liquid Dicyanate Monomer For Rapid Impregnation of Reinforcing Fibers", May 8-11, 1989, Presented at the 34th International Sampe Symposium, Reno, pp. 1326-1346.

Article on "ArcoCy Cyanate Ester Safety and Handling Bulletin", Hi-Tek Polymers, Jeffersontown, Ky., Table 1 attachment, ArcoCy Safety and Handling May 1989.

Hans Steinegger, "Smart Cards: Bonding Technology at its Limits," Microeletronics Mfg. Tech., Dec. 1992, pp. 13-15.

D. A. Shimp et al., "AroCy® Cyanate Ester Resin, Chemistry, Properties and Applications," Rhône-Poulenc, Inc.; Jan 1990, pp. 1-36.

E. Grigat and R. Putter, "New Methods of Preparative Organic Chemistry VI-Synthesis and Reactions of Cyanic Esters, " Agnew. Chem. Internat. Edit., vol. 6, Nov. 3, 1967, pp. 206-216.

(List continued on next page.)

Primary Examiner—John Kight, III
Assistant Examiner—John M. Cooney, Jr.
Attorney, Agent, or Firm—Christie, Parker & Hale

[57] ABSTRACT

Described is a rapidly curing adhesive formulation and a method of reducing the curing time of an adhesive formulation containing cyanate ester.

14 Claims, 7 Drawing Sheets

OTHER PUBLICATIONS

Hi-Tek Polymers, "AroCy® L-10 Cyanate Ester Monomer," Oct. 1989.
Hi-Tek Polymers, "AroCy® Cyanate Ester Resins."
Hi-Tek Polymers, "AroCy® F-40S Cyanate Ester Resin Solution," Apr. 1989.
Hi-Tek Polymers, "AroCy® B-10 Cyanate Ester Monomer," Oct. 1988.
Hi-Tek Polymers, "AroCy® B-40S Cyanate Ester Resin Solution," Oct. 1988.
Hi-Tek Polymers, "AroCy® B-50 Cyanate Ester Hard Resin," Oct. 1988.
Hi-Tek Polymers, "AroCy® M-10 Cyanate Ester Monomer," Oct. 1988.
Hi-Tek Polymers, "AroCy® M-30 Cyanate Ester Semisolid Resin," Oct. 1988.
Hi-Tek Polymers, "AroCy® M-40S Cyanate Ester Resin Solution," Oct. 1988.
Hi-Tek Polymers, "AroCy® Cyanate Ester Hard Resin," Oct. 1988.
Hi-Tek Polymers, "AroCy® T-30 Cyanate Ester Semisolid Resin," Oct. 1988.
Allied Signal Inc., "Primaset-PT Resins, Safety and Handling Bulletin," Mar. 20, 1992.
Allied Signal Inc., "Primaset-PT Resins."
Allied-Signal Inc., "Primaset-PT Resins, Literature List."
Tactix Performance Polymers, "XU-71787.02, XU-71787.07, Developmental Polycyanate Resins for Advanced Composites and Adhesives."
Sajal Das, "Phenol-Triazine (PT) Resin, A New Family of High Performance Thermosets" Cyanate Ester Symposium, Apr. 9-10, 1992.
D. A. Shimp and S. J. Ising, "Moisture Effects and their Control in the Curing of Polycyanate Resins," Cyanate Ester Symposium, Apr. 9-10, 1992.
S. L. Simon and J. K. Gillham, "Cure of a Dicyanate Ester/Polycyanurate System," Cyanate Ester Symposium, Apr. 9-10, 1992.
Fraunhofer Institut fur Angewandte Materialforschung, "Polycyanurates and Their Modifications, State of the Art and New Aspects," Gordon Research Conference on Thermoset, Jun. 1993.
Hi-Tek Polymers, "AroCy® Resins," Dec. 1988.
David Shimp and Mark Southcott, "Controlling Moisture Effects During the Curing of High $T_G$ Cyanate Ester/Aramid Composites," 38th International Symposium and Exhibition, May 10-13, 1993.
Rhône-Poulenc, "Specialty Resins-Reactive Rubber Tougheners for Arocy® Cyanate Ester Resins," Jan. 1991.
Rhône-Poulenc, "Specialty Resins-Pyrolysis of AroCy® Cyanate Esters."
Rhône-Poulenc, "Specialty Resins-Quantative Determination of Residual Cyanate in Cured Homopolymers Via FTIR Analysis," Jan. 2, 1992.
Rhône-Poulenc, "Specialty Resins-Compatibility of Cyanate Esters with Aramid Reinforcements and Polyamide/Imide Substrates."
Rhône-Poulenc, "Specialty Resins-AroCy® L-10 Cyanate Ester Monomer," Sep. 1990.
Rhône-Poulenc, "Specialty Resins-AroCy® F-10 Cyanate Ester Monomer," Sep. 1990.
Rhône-Poulenc, "Specialty Resins-AroCy® M-20 Low Melt Viscosity Prepolymer," Sep. 1990.
Rhône-Poulenc, "Specialty Resins-AroCy® B-10 Cyanate Ester Monomer," Oct. 1990.
Rhône-Poulenc, "Specialty Resins-Toxicity of AroCy® Cyanate Esters."
Rhône-Poulenc, "Specialty Resins-AroCy® M-10 Cyanate Ester Monomer," Sep. 1990.
Rhône-Poulenc, "Specialty Resins-AroCy® Cyanate Ester Resins."
Rhône-Poulenc, "Specialty Resins-AroCy® Cyanate Ester Resins" list.
Rhône-Poulenc, "Specialty Resins-AroCy® F-40S Cyanate Ester Resin Solution," Jul. 1990.
Rhône-Poulenc, "Specialty Resins-AroCy® B-30 Cyanate Ester Semisolid Resin."
Rhône-Poulenc, "Specialty Resins-AroCy® B-40S Cyanate Ester Resin Solution," Aug. 1990.
Rhône-Poulenc, "Specialty Resins-AroCy® B-50 Cyanate Ester Hard Resin," Sep. 1990.
Rhône-Poulenc, "Specialty Resins-AroCy® M-40S Cyanate Ester Resin Solution," Aug. 1990.
Rhône-Poulenc, "Specialty Resins-AroCy® M-30 Cyanate Ester Semisolid Resin," Sep. 1990.

(List continued on next page.)

OTHER PUBLICATIONS

Rhône-Poulenc, "Specialty Resins–AroCy® M-50 Cyanate Ester Hard Resin," Sep. 1990.

Rhône-Poulenc, "Specialty Resins–AroCy® Cyanate Ester Safety and Handling Bulletin," Sep. 1990.

Rhône-Poulenc, "Specialty Resins–Formulating Arocy® Cyanate Esters for Resin Transfer Molding Applications," Apr. 1991.

Rhône-Poulenc, "Specialty Resins–AroCy® Cyanate Ester Adhesives for Polyimide Flexible Circuitry," Jan. 1991.

Rhône-Poulenc, "Galvanic Corrosion of Carbon Fiber Composites," Jan. 1991.

Hi–Tek Polymers, "REX-378 Developmental Cyanate Ester Prepolymer."

Uri Sela and Hans Steinegger, "Dispensing Technology–The Key to High-Quality, High-Speed Die Bonding," *Microelectronics Manufacturing Technology*, Feb. 1991, pp. 47–52.

Jack R. Christenson and David A. Shimp, "Improvements in Performance and Processing Using Cyanate Ester Blends and Alloys," Ultralloy '90, pp. 191–208.

Tony del Rosario, "JM 7000 Low Temperature Die Attach Material Qualification Report," Olin Interconnect Tecnhologies, Dec. 10, 1992.

Malcolm L. White, et al., "Attaining Low Moisture Levels in Hermetic Packages," *IEEE/Proc. IRPS*, 1982, pp. 253–259.

David P. Galloway and My N. Nguyen, "A New, Reliable Snap Cure Die Attach Adhesive," *Mat. Res. Soc. Symp. Proc.*, vol. 264, 1992, pp. 271–280.

Sue Oliver, et al., "Silver/Polymer Die Attach for Ceramic Package Assembly," 1992 IEPS meeting, Sep. 27–30, 1992.

My N. Nguyen and Michael B. Grosse, "Low Moisture Polymer Adhesive for Hermetic Packages," *IEEE Trans. on Components, Hybrids and Manufacturing Technology*, vol. 15, No. 6, Dec. 1992, pp. 964–971.

Richard H. Estes, "A Practical Approach to Die Attach Adhesive Selection," *Hybrid Circuit Technology*, Jun. 1991.

Tom Ramsey and Gail Heinen, "Controlling Moisture in Ceramic Packages," *Semiconductor International*, Aug. 1988.

Mitsubishi Gas Chemical Company, Inc., "High Heat Resistant BT Resin-Bismaleimide-Triazine Resin," Fourth Edition, Sep. 1, 1984.

Sue Oliver, "Qualification Status and Extended Stressing of JM7000 Silver/Polyner Die Attach Adhesive for Ceramic Package Assembly, " Jan. 12, 1993.

Hi–Tek Polymers, "AroCy® F-10 Cyanate Ester Monomer," Apr. 1989.

Hi–Tek Polymers, AroCy® B-30 Cyanate Ester Semisolid Resin," Oct. 1988.

Andrew Rosenbaum, "Smarter and Smarter," Electronics, Oct. 1991, 32D & 32E.

Daniel Webb, "What Future is in the PC Cards?" Electronic Business, Nov. 4, 1991, p. 11.

"Japan Challenges Intel's Lead in Flash Memories," attached chart World EPROM Market, Semiconductors.

RATE OF CYANATE TRIMERIZATION FOR AROCY B-10 MONOMER AT 200°C. AMORPHOUS PREPOLYMERS ARE FORMED AT 30-50% CONVERSION.

RAPIDLY CURING ADHESIVE AND METHOD

CROSS REFERENCE TO RELATED APPLICATIONS

This application is a continuation of application Ser. No. 07-843,739 filed Feb. 28, 1992, now abandoned, and a continuation-in-part of application Ser. No. 07-602,504 filed Oct. 24, 1990 now U.S. Pat. No. 5,150,195.

FIELD OF THE INVENTION

The present invention relates to a rapidly curing adhesive for bonding a semiconductor device to a substrate, more particularly, to a cyanate ester-containing adhesive and to a method of reducing the curing time of a cyanate ester-containing adhesive.

BACKGROUND OF THE INVENTION

In my copending application Ser. No. 07/602,504 filed Oct. 24, 1990, U.S. Pat. No. 5,150,195 there is disclosed an adhesive formulation, suitable for bonding semiconductor devices to a substrate, which can be rapidly cured. Prior to the invention described in my aforementioned copending application, organic adhesive had been used to bond semiconductor devices to metal lead frames and other substrates. Typical die attach adhesives which had been used for this purpose include either epoxy or polyimide material and precious metal. The improved rapidly curing adhesive described in my copending application contains a cyanate ester, alkylphenol and metal curing catalyst. Adhesive formulations of the type described have the property of being able to be cured in a very short time at relatively low temperature, i.e., 5 minutes or less, at 200° C. This cyanate ester adhesive formulation generally includes 60 to 90 wt. % of an electrically and/or thermally conductive filler. Typical electrically conductive fillers useful in the formulation are silver or nickel.

I have now determined it is not necessary to include as much silver in the adhesive formulation and that a small but effective amount of silver may be incorporated in a cyanate ester-containing adhesive formulation to reduce the curing time at a temperature less than the glass transition temperature of the cyanate ester-containing adhesive. More particularly, I have discovered that as little as up to 15% to 20% of silver, present as either uncoated flake and powder particles or flake and powder particles coated with surfactants (as normally purchased commercially), can be effective to significantly reduce the curing time of a cyanate ester-containing adhesive when present with a curing co-catalyst such as an alkylphenol and/or a metal compound of, for example, cobalt. I have also discovered that co-curing catalysts may be omitted and that somewhat greater amounts of silver alone will function as a catalyst to achieve rapid curing when no curing co-catalyst is present.

SUMMARY OF THE INVENTION

In accordance with the present invention, there is provided two embodiments of a rapidly curing adhesive for bonding a semiconductor device to a substrate. One embodiment comprises a cyanate ester vehicle, an alkylphenol, a metal-containing curing catalyst and a small but effective amount of silver to act as co-catalyst to impart the property of rapid curability to the adhesive. The silver in this embodiment is present in an amount of not greater than about 20% by weight and is selected from the group consisting of uncoated flake and powder silver particles and flake and powder silver particles coated with a surfactant. Also in accordance with the invention is an embodiment of a rapidly curing adhesive comprising a cyanate ester vehicle and silver but without a curing co-catalyst. In the latter embodiment 20% to 90% silver will impart rapid curing capability to the cyanate ester containing adhesive.

The silver particles used in accordance with the invention have a particle size within the range of 0.1 to 50 $\mu$m, a surface area of 0.1 to 2 $m^2/g$ and tap density of 2 to 5 g/cc. In a preferred embodiment adding a small but effective amount of a commercially pure silver in an amount not greater than about 20 wt. % to a cyanate ester-containing adhesive comprising 10 to 40 wt. % cyanate ester vehicle, 0.1 to 2 wt. % alkylphenol, and 0.01 to 0.1 wt. % of a metal-containing curing catalyst will reduce the formulation curing time. The silver catalyst is selected from the group consisting of uncoated flake and powder particles and flake and powder particles coated with a surfactant, said particles having a particle size within the range of 0.1 to 50 $\mu$m, a surface area of 0.1 to 2 $m^2/g$ and a tap density of 2 to 5 g/cc.

DESCRIPTION OF PREFERRED EMBODIMENTS

Figure 1:
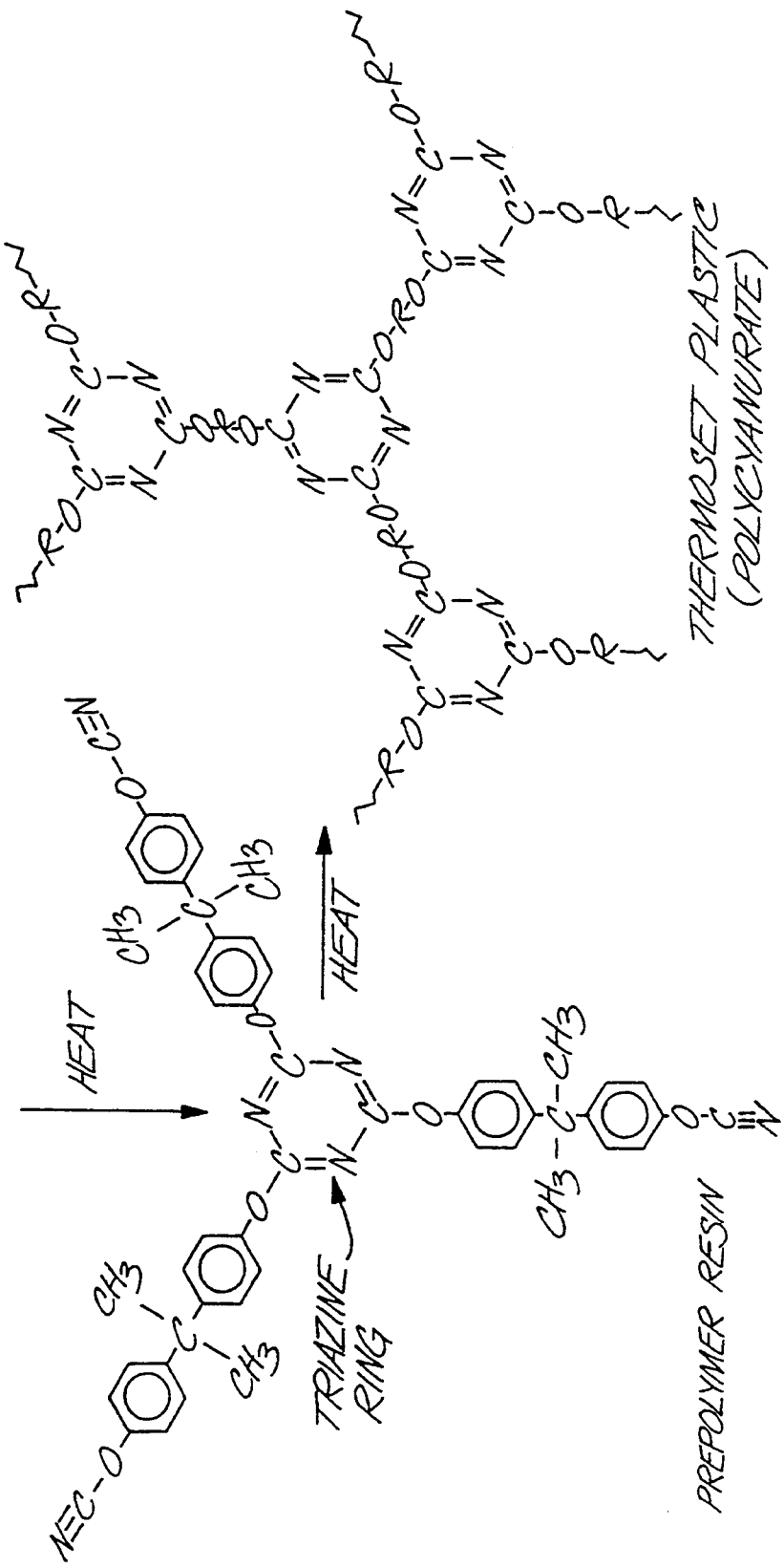
FIG. 1 is a diagram describing the cyanate ester curing reactions.
Figure 2:
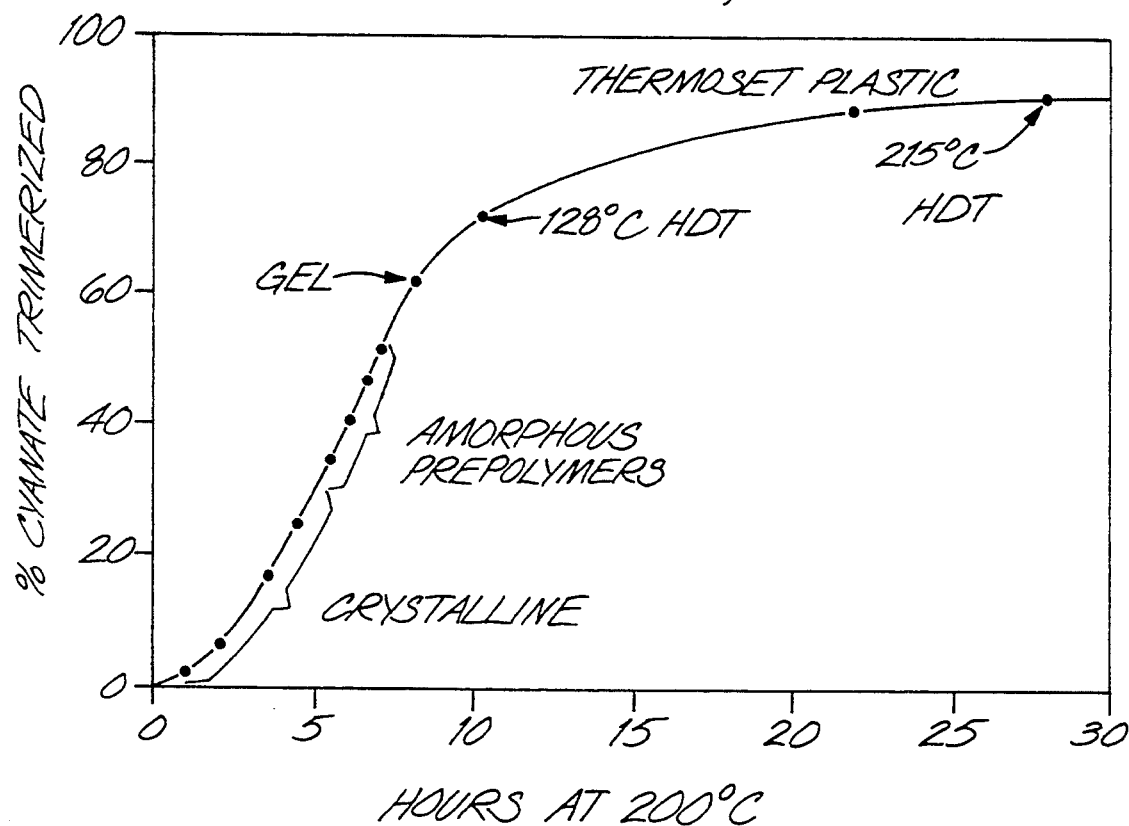
FIG. 2 is a graph showing the isothermal polymerization of bisphenol adicyanate (uncatalyzed)

As can be seen in FIG. 1, starting with the dicyanate monomer, the prepolymer resin is cured by a cyclotrimerization to produce a polycyanurate thermoset plastic. The trimerization rates of uncatalyzed liquid or molten commercial dicyanates are impratically slow, as shown in FIG. 2. This is consistent with what has been known about cyanate ester-containing adhesives prior to my invention as, for example, indicated by Shimp in U.S. Pat. No. 4,604,452. In that patent, curing of cyanate ester monomers is disclosed using a metal carboxylate catalyst such as copper, tin, lead, maganese, nickel, iron, zinc or cobalt with an active hydrogen compound such as alkylphenol added to catalyze the formation of triazine rings. However, the curing reactions described are extremely slow. As indicated by Shimp, the typical curing time required is three hours at 177° C. or two hours at 200° C.

In my prior application, I described cyanate ester containing adhesive formulations with the property of being able to be cured at five minutes or less at 200° C. These formulations included 60% to 90% of a filler such as silver flake or powder. Since silver particles which are commercially available normally have a coating, a surfactant such as silver stearate on the particle surfaces, an investigation was conducted to determine whether the surfactant coating affected the use of silver as a catalyst to reduce the curing time of the cyanate ester-containing formulation that contains silver as a filler. It was determined that the surfactant coating does not influence the usefulness of silver as a catalyst for reducing the curing time of cyanate ester-containing adhesive formulations and, thus, coated and uncoated silver particles are usable, The compositions described in Table I below show various cyanate ester-containing compositions. Examples A–D show compositions of cyanate ester-containing formulations, some of which have 60% to 90 wt. % silver. Example A includes a metal curing catalyst (cobalt acetylacetonate) and alkylphenol with silver whereas Examples C and D include only alkylphenol with silver. Example B excludes both alkylphenol and the metal curing co-catalysts and, thus, only contains silver and cyanate ester.

TABLE I

|  | A | B | C | D |
|---|---|---|---|---|
| Cyanate Ester (Arocy L10) | 24.26 | 25.00 | 24.30 | 24.30 |
| Cobalt Acetylactonate | 0.04 | 0 | 0 | 0 |
| Nonylphenol | 0.70 | 0 | 0.70 | 0.70 |
| Silver flake (99.6% Ag) | 75.00 | 75.00 | 75.00 | 0 |
| Silver powder (99.99% Ag) | 0 | 0 | 0 | 75.00 |
| Total | 100.0 | 100.0 | 100.0 | 100.0 |
| Die shear, kg (*) cure @ 200° C., 30 sec | 13.5 | 13.4 | 14.0 | 15.2 |

(*)80 × 80 mil die attached on 6 mil thick copper lead frame

Figure 3:
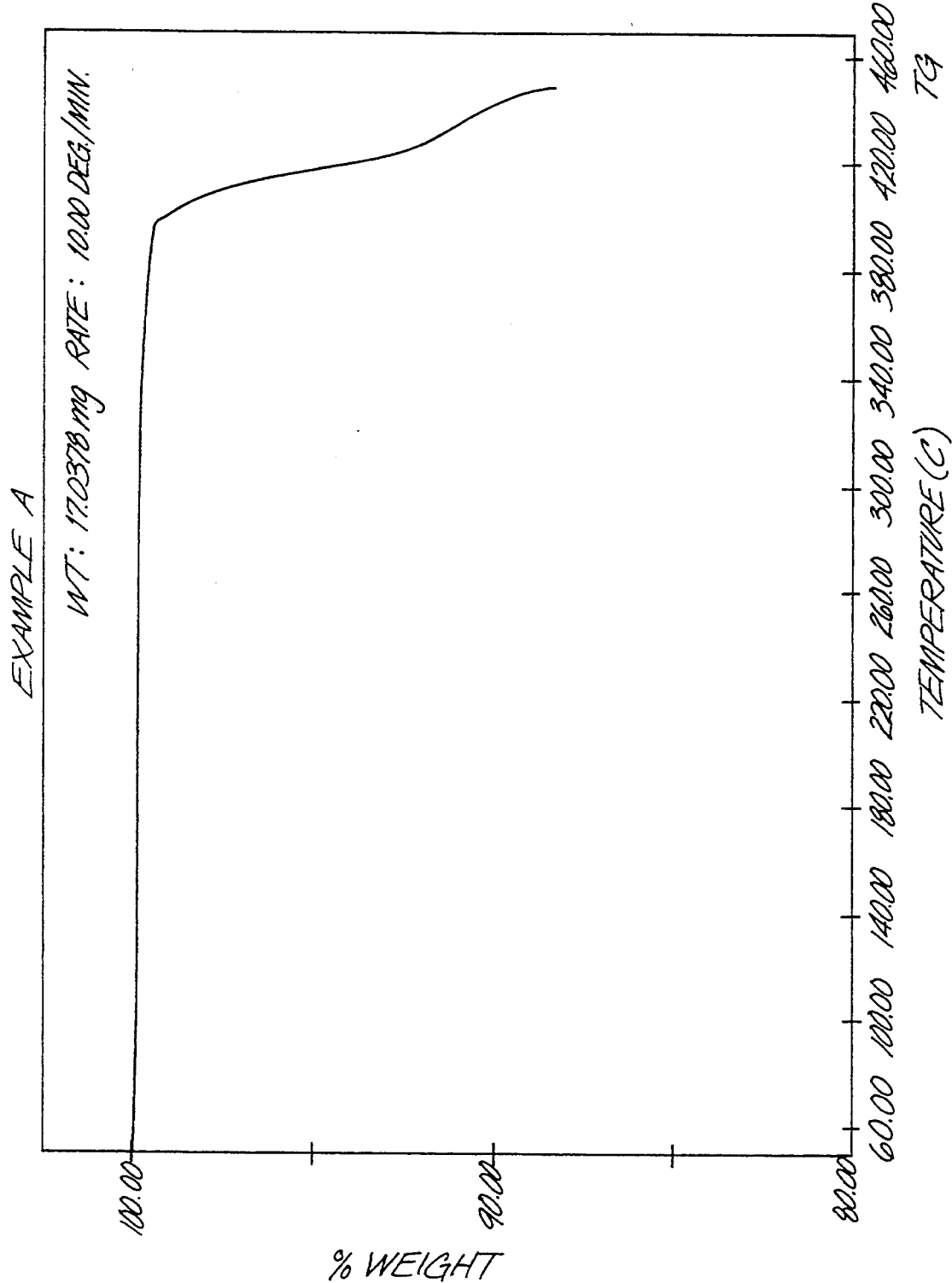
FIGS. 3, 4 and 5 are graphs showing the weight loss of die attach adhesive examples described in the application.
Figure 4:
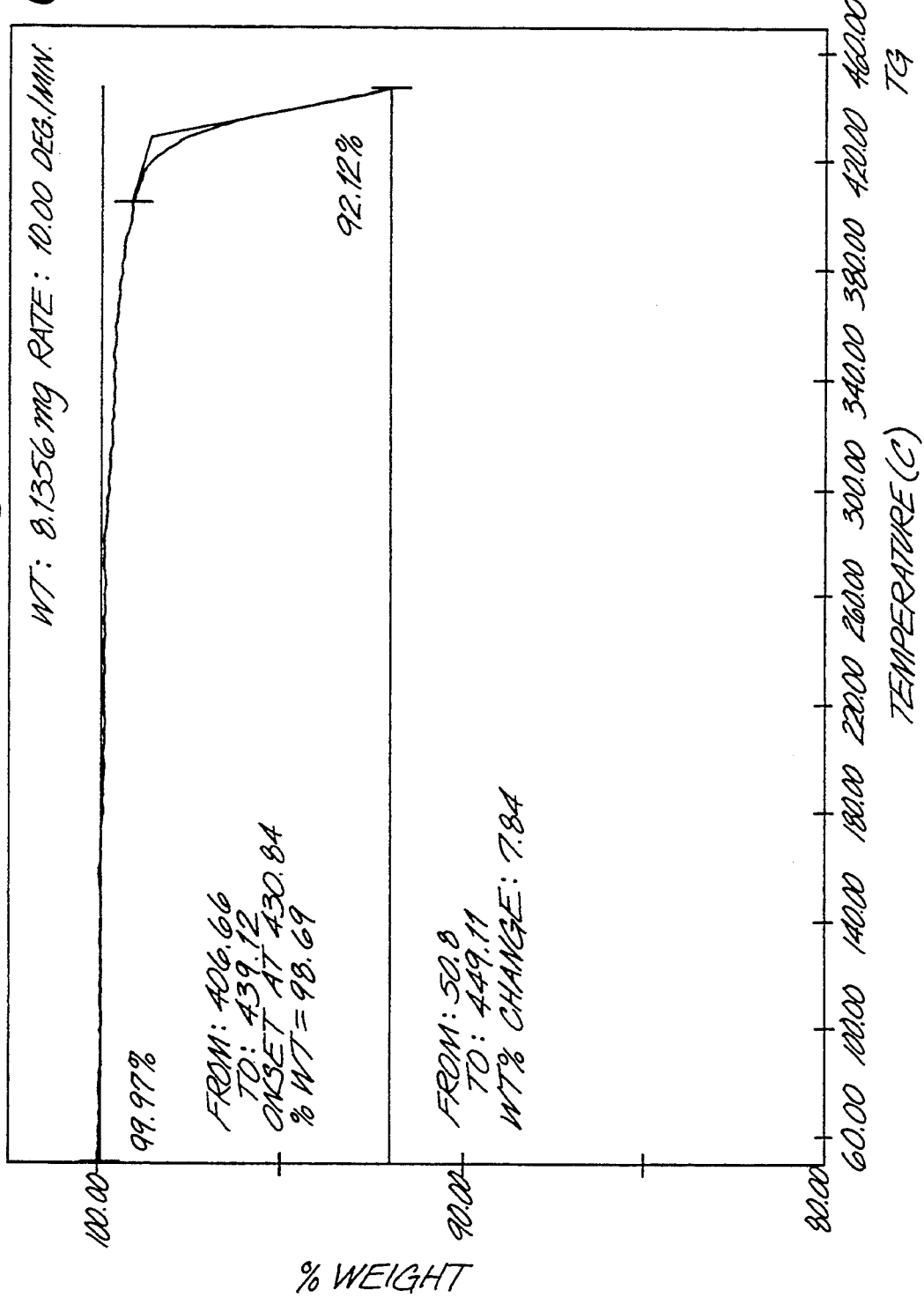
Figure 5:
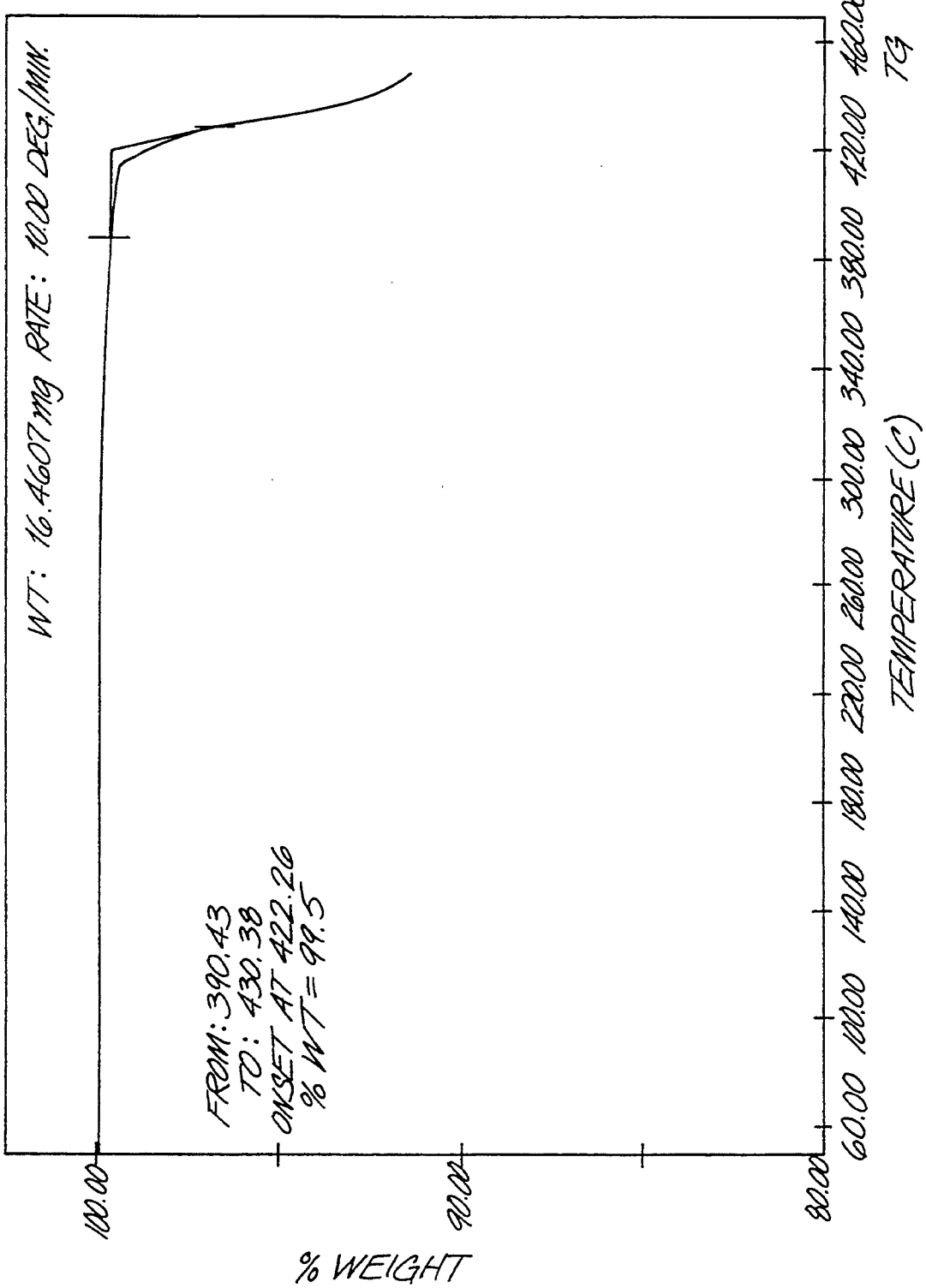
Figure 6:
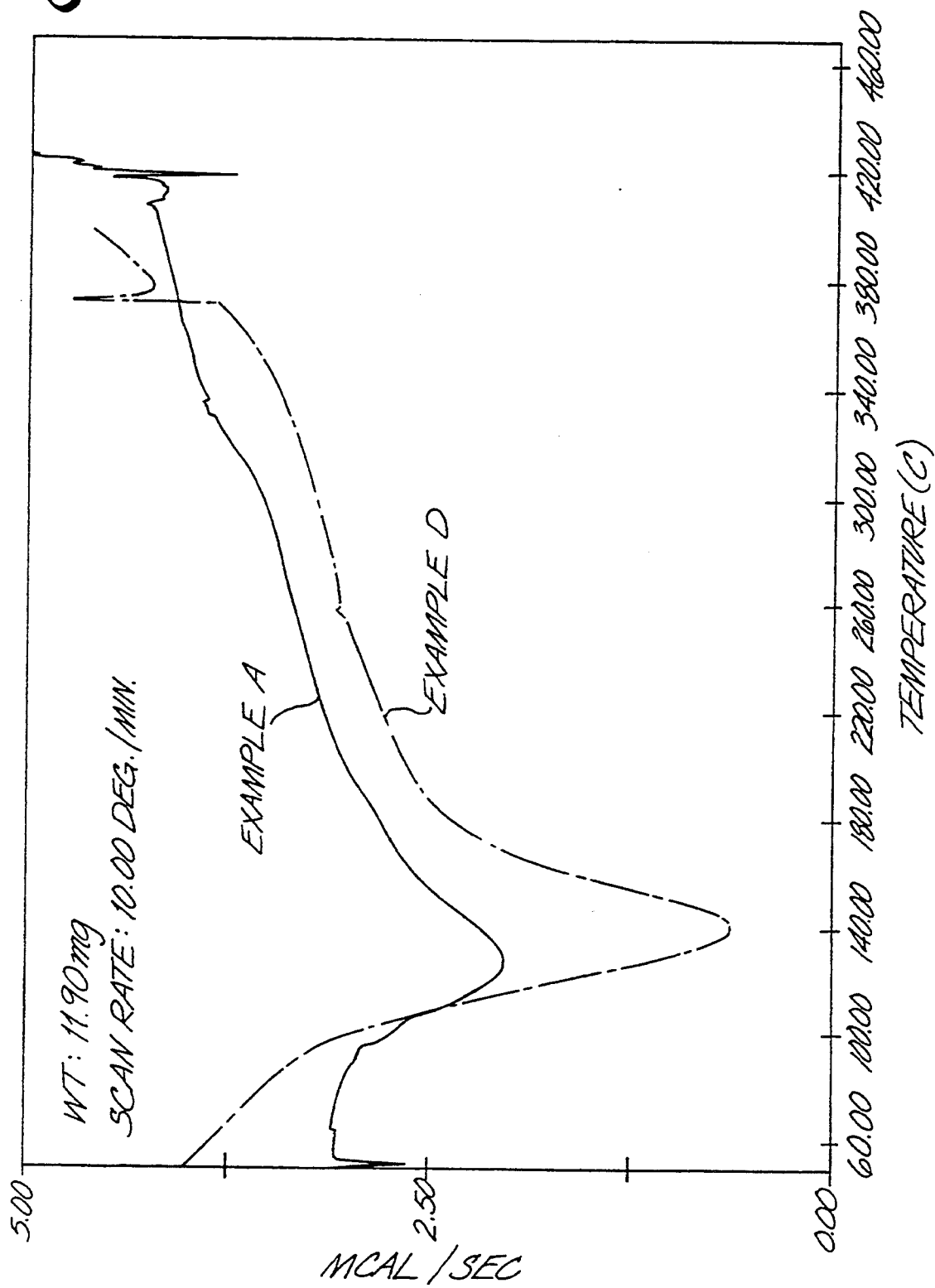
FIGS. 6 and 7 are graphs showing cure characteristics for examples disclosed in the application.
Figure 7:
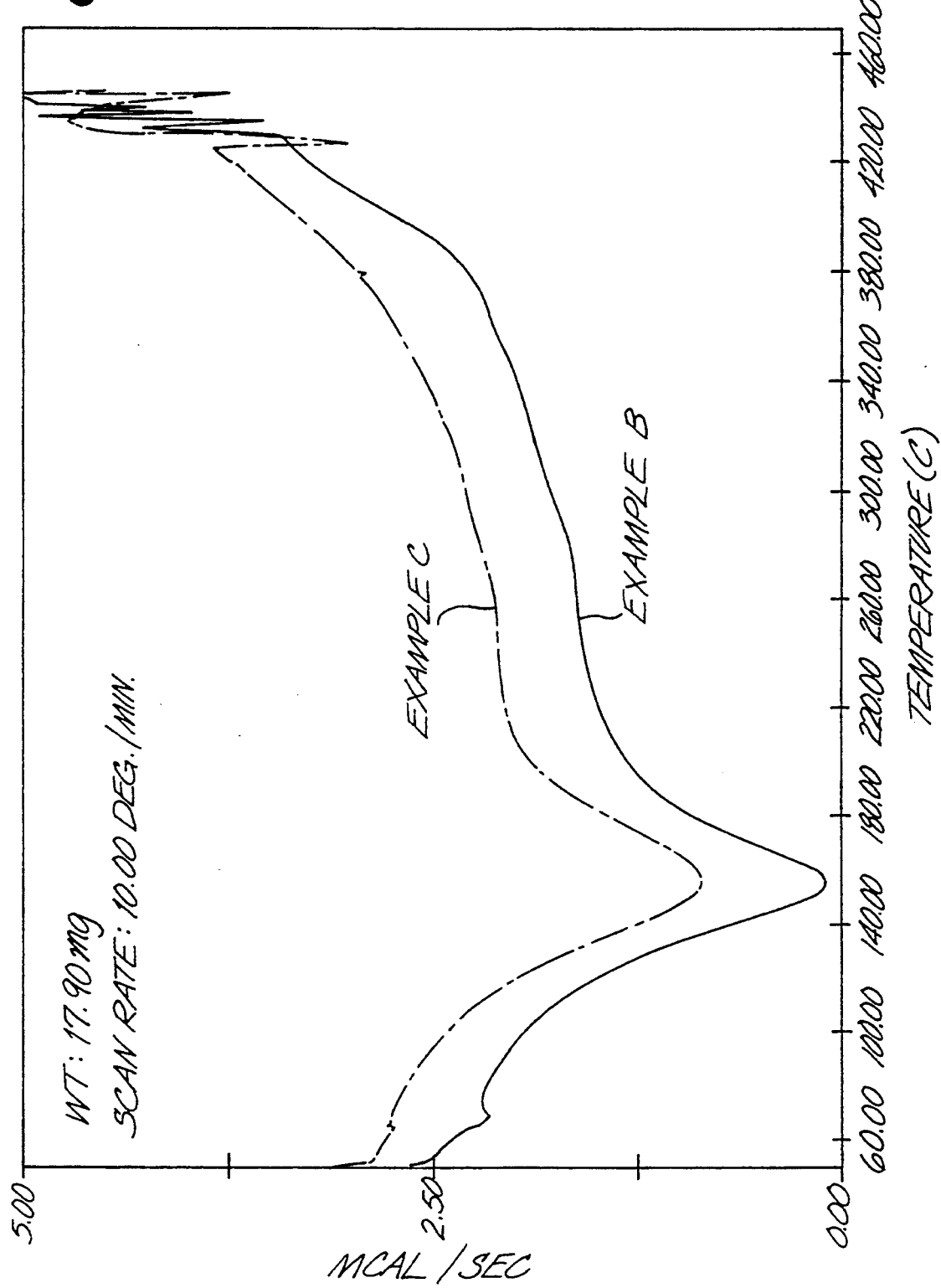

As generally recognized, and as used herein, complete cure is defined as the condition achieved at the highest strength. One method used to determine the degree of cure is to measure the adhesive strength of a bonded material. For example, the curing time shown FIG. 2 is two minutes at 160° C. or 30 seconds at 200° C. to achieve maximum adhesion strength. This may be compacted with the rate of cure for uncatalyzed cyanate ester monomers which require as much as 30 hours, shown in FIG. 3.

The curing schedule for Examples A and B–G (see Table II) were all the same. The differences examples B and C are in the use of active hydrogen compounds such as nonylphenol or aromatic amines (Universal Oil Product's Product "Unilink 4200") which are added to facilitate triazine ring formation. As can be seen from the foregoing results all examples were able to be cured rapidly and possessed good die shear strength.

In examples F–G (Table II) the compositions are for a thermal conductive package where a small amount silver is useful as a catalyst to minimize curing time. In these examples, the silver used has a particle size of less than 50 μm, a surface area of 0.1–2 m²/g and tap density of 2.0–5.0 g/cc. Other filler materials such as SiC, Si, and Ni may also be included and, when present, may be in particle size ranges of 50 microns or The examples in Table II and Table III illustrate the effect of a small but effective amount of silver on the curing time where curing co-catalysts are also included in the adhesive formulation. Thus, additional improvement is achieved by the presence of —OH, or NH groups in amounts as little as 0.5 to 6.0 parts per hundred of cyanate ester resin. This addition also achieves complete conversion and maximum adhesive strength, thus accelerating curing time.

TABLE II

|  | E | F | G | H |
|---|---|---|---|---|
| Cyanate Ester (Arocy L10) | 24.26 | 24.26 | 24.26 | 24.26 |
| SiC powder | 75.00 | 71.25 | 67.50 | 60.0 |
| Cobalt Acetylactonate | 0.04 | 0.04 | 0.04 | 0.04 |
| Nonylphenol | 0.70 | 0.70 | 0.70 | 0.70 |
| Silver powder | 0 | 3.75 | 7.50 | 15.0 |

TABLE II-continued

|  | E | F | G | H |
|---|---|---|---|---|
| Total | 100.0 | 100.0 | 100.0 | 100.0 |

TABLE III

|  | E | F | G | H |
|---|---|---|---|---|
| Cure @ 200° C. for |  |  |  |  |
| 30 sec, kg | 6.9 | 8.9 | 10.6 | 14.2 |
| 60 sec | 10.7 | 9.3 | 8.6 | 15.4 |
| 120 sec | 13.6 | 14.9 | 14.5 | 13.7 |

In examples E–H, the silver percentage increases from 0 to 15 wt %. The adhesive strength of the compositions described in Table II are shown in Table III. In these examples the curing schedule was 200° C. for 30, 60 and 120 seconds, as indicated.

As can be seen by the adhesive strength data in Table III, full curing, as measured by adhesive strength, can be achieved in as little as 30 seconds, although higher strengths is obtained with slightly longer curing time, i.e., 120 sec., but still well in the rapid curing range, i.e., less than 5 minutes at 200° C., preferably less than 2 minutes at 200° C.

Typical properties of the silver co-catalyst added to the cyanate ester-containing adhesive formulation to reduce curing time in accordance with the invention are:

particle sizes 0.1–50 μm;
surface area 0.1–2.0 m²/g;
tap density 2–5 g/cc.

To achieve the benefits of the invention, silver, powder or flake can be blended with other fillers into cyanate ester adhesive formulations to develop the property of being able to be cured rapidly. In such cases from 10 to 20% of silver by weight will be advantageous. The curing time reduction achievable with this modest amount of silver is the same as that achieved by formulations with 60 to 90 wt. % silver.

The data in Table IV below shows that the addition of silver alone improves curing efficiency. The gel point, or gelation, shown in Table IV is a measure of curing efficiency because it indicates the time required for onset formation of thermoset material. As indicated by the data reported in Table IV, the addition of from small amounts to large amounts of silver impacts on the gel point by reducing it significantly below the gel point of a composition devoid of silver.

TABLE IV

| Composition | A | B | C | D | E | F | G | H |
|---|---|---|---|---|---|---|---|---|
| Cyanate ester (L10) (wt. %) | 33.3 | 31.6 | 30 | 28.4 | 27.3 | 32.3 | 20 | 19.9 |
| Silicon Carbide (wt. %) | 66.7 | 63.1 | 60 | 57.1 | 54.5 |  |  |  |
| Silver flake (wt. %) | 0 | 5.3 | 10 | 14.3 | 18.2 | 66.7 | 80 | 79.7 |
| Nonylphenol (wt. %) |  |  |  |  |  |  | 0 | 0.4 |
| Gel point, sec at 200° C. | 300 | 110 | 75 | 60 | 50 | 30 | 30 | 10 |

Further improvement in reducing curing time for cyanate ester-containing adhesive formulations is achieved by including nonylphenol as additional co-catalyst with silver. The data shown in Table IV indicates the effect of nonylphenol on the gel point during curing. The gel point, or gelation, is also a measure of curing efficiency. It indicates the time required for onset formation of thermoset material. As previously shown the addition of silver can drastically reduce gel time and therefore achieves faster curing. At silver levels of about 4 to 20% by weight, preferably 10 to 20%, significant reduction in curing time may be achieved.

It is apparent from the foregoing that various changes and modifications may be made without departing from the invention. Accordingly, the scope of the invention should be limited only by the appended claims where what is claimed is:

1. A rapidly curing adhesive for bonding a semiconductor device to a substrate capable of being cured in less than five minutes at 200° C. consisting essentially of a cyanate ester vehicle, an active hydrogen compound from the group of aromatic amines and alkylphenols, a metal-containing curing catalyst and a small but effective amount of silver to act as a co-catalyst to facilitate the rapid curability of said adhesive, said silver being present in an amount of not greater than about 20 wt. % and selected from the group consisting of uncoated flake and powder particles and flake and powder particles coated with a surfactant, and mixtures thereof, said particles having a particle size within the range of 0.1 to 50 μm and a surface area of 0.1 to 2 m$^2$/g.

2. A method of reducing the curing time at a temperature less than its glass transition temperature of cyanate ester-containing adhesives used for bonding a semiconductor device to a substrate to less than five minutes at 200° C., said adhesive consisting essentially of 10 to 40 wt. % cyanate ester vehicle, 0.1 to 2 wt. % alkylphenol, and 0.01 to 0.1 wt. % of a metal-containing curing catalyst, said method comprising adding to said adhesive a small but effective amount of a co-curing catalyst comprising commercially pure silver in an amount not greater than about 20 wt. %, said silver selected from the group consisting of uncoated flake and powder particles and flake and powder particles coated with a surfactant, said particles having a particle size within the range of 0.1 to 50 μm and a surface area of 0.1 to 2 m$^2$/g.

3. A rapidly curing adhesive for bonding a semiconductor device to a substrate capable of being cured in less than five minutes at a temperature of 200° C. consisting essentially of a cyanate ester vehicle and an amount of silver to act as a co-catalyst to facilitate the rapid curability of said adhesive, said silver being present in an amount of 60 to 90 wt. % and selected from the group consisting of uncoated flake and powder particles and flake and powder particles coated with a surfactant, and mixtures thereof, said particles having a particle size within the range of 0.1 to 50 μm and a surface area of 0.1 to 2 m$^2$/g.

4. A method of reducing the curing time at a temperature less than its glass transition temperature of cyanate ester-containing adhesives used for bonding a semiconductor device to a substrate to less than five minutes at a temperature of 200° C., said method comprising adding to said adhesive 60 to 90 wt. % commercially pure silver, said silver selected from the group of uncoated flake and powder particles and flake and powder particles coated with a surfactant, said particles having a particle size within the range of 0.1 to 50 μm and a surface area of 0.1 to 2 m$^2$/g.

5. A rapidly curing adhesive for bonding a semiconductor device to a substrate capable of being cured in less than five minutes at 200° C. consisting essentially of 10 to 40 wt. % cyanate ester vehicle and an amount of silver which is effective to facilitate the rapid curability of said adhesive, said silver being present as particles in an amount of not greater than about 90 wt. % and selected from the group consisting of uncoated flake and powder and flake and powder coated with a surfactant, and mixtures thereof, said particles having a particle size within the range of 0.1 to 50 μm and a surface area of 0.1 to 2 m$^2$/g.

6. A method of reducing the curing time at a temperature less than its glass transition temperature of cyanate ester-containing adhesives used for bonding a semiconductor device to a substrate to less than five minutes at 200° C., said method comprising adding to said adhesive up to 90 wt. % commercially pure silver, said silver selected from the group of uncoated flake and powder particles and flake and powder particles coated with a surfactant, said particles having a particle size within the range of 0.1 to 50 μm and a surface area of 0.1 to 2 m$^2$/g.

7. A rapidly curing adhesive according to claim 1 wherein silver is present in an amount of 4 to 20 wt. %.

8. A rapidly curing adhesive according to claim 1 wherein silver is present in an amount of 10 to 20 wt. %.

9. A rapidly curing adhesive according to claim 1 wherein said active hydrogen compound is present in an amount of 0.5 to 6 parts per hundred of cyanate ester.

10. A method according to claim 2 wherein the commercially pure silver is added to said adhesive in an amount of 4 to 20 wt. %.

11. A method according to claim 2 wherein commercially pure silver is added to said adhesive in an amount of 10 to 20 wt. %.

12. A rapidly curing adhesive according to claim 5 wherein silver is present in an amount of 20 to 90 wt. %.

13. A method according to claim 6 wherein silver is added in amount of up to 20 wt. %.

14. A rapidly curing adhesive according to claim 1 wherein the tap density of the silver particles is 2 to 5 g/cc.

* * * * *